(12) United States Patent
Ueda

(10) Patent No.: US 11,073,589 B2
(45) Date of Patent: Jul. 27, 2021

(54) DIAGNOSTIC METHOD FOR INSPECTION DEVICE AND INSPECTION SYSTEM

(71) Applicant: TOKYO ELECTRON LIMITED, Tokyo (JP)

(72) Inventor: Masanori Ueda, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 16/493,736

(22) PCT Filed: Feb. 7, 2018

(86) PCT No.: PCT/JP2018/004178
§ 371 (c)(1),
(2) Date: Sep. 12, 2019

(87) PCT Pub. No.: WO2018/168263
PCT Pub. Date: Sep. 20, 2018

(65) Prior Publication Data
US 2020/0003860 A1 Jan. 2, 2020

(30) Foreign Application Priority Data

Mar. 16, 2017 (JP) .............................. JP2017-050854

(51) Int. Cl.
*G01R 35/00* (2006.01)
*G01R 1/073* (2006.01)

(52) U.S. Cl.
CPC ......... *G01R 35/00* (2013.01); *G01R 1/07307* (2013.01)

(58) Field of Classification Search
CPC .... G01R 1/067; G01R 1/06794; G01R 31/28; G01R 31/2808; G01R 31/2886; G01R 31/2889; G01R 31/2891; G01R 35/00; G01R 1/073; G01R 1/07307; G01R 31/66; H01R 43/00
See application file for complete search history.

(56) References Cited

FOREIGN PATENT DOCUMENTS

| JP | H08-306750 A | 11/1996 |
| JP | H10-150082 A | 6/1998 |
| JP | 2011-106980 A | 6/2011 |

OTHER PUBLICATIONS

PCT International Search Report and Written Opinion, PCT Application No. PCT/JP2018/004178, dated May 15, 2018, 10 pages (with English translation of PCT International Search Report).

*Primary Examiner* — Son T Le
(74) *Attorney, Agent, or Firm* — Fenwick & West LLP

(57) ABSTRACT

An inspection device has an attachment part for attaching a probe card in an inspection operation but attaching a diagnosis substrate in a self-diagnosis operation. During the inspection operation, a tester of the inspection device applies electrical signals to devices formed on a substrate through the probe card and multiple connectors of a connection member to inspect electrical characteristics of the devices During the self-diagnosis operation, a diagnosis substrate is attached to the attachment part of the inspection device instead of the probe card and a stabilization process is performed for stabilizing a contact between the diagnosis substrate and the connectors of the connection member after the diagnosis substrate is attached. The diagnosis of the multiple connectors is performed after the stabilization process.

14 Claims, 7 Drawing Sheets

DIAGNOSTIC METHOD FOR INSPECTION DEVICE AND INSPECTION SYSTEM

TECHNICAL FIELD

The present disclosure relates to a diagnostic method for an inspection device for inspecting electrical characteristics of a target object, and an inspection system.

BACKGROUND

In a semiconductor device manufacturing process, an electrical inspection of semiconductor devices (hereinafter, simply referred to as "devices") formed on a semiconductor wafer (hereinafter, simply referred to as "wafer") is performed upon the completion of all processes on the wafer. The inspection is performed by an inspection device referred to as a prober. The prober includes a probe card facing the wafer, and the probe card includes a plate-shaped base member and a plurality of probes arranged at the base member to face electrodes of the semiconductor devices on the wafer (see, e.g., Patent document 1).

In the prober, the wafer is pressed to the probe card by using a stage for attracting and holding the wafer to bring the probes of the probe card into contact with the electrodes of the devices formed on the wafer. Then, electrical signals are applied from a tester to the electrodes of the devices through the probes of the probe card, and various electrical characteristics of the devices are inspected by using electrical signals from the devices.

The tester used in the inspection device includes tester module boards each configured to apply an electrical signal to the devices formed on the wafer and measure the electrical characteristics of the devices, and a tester main board serving as a part of an interface between the probe card and the tester module board. A contact block serving as an interface unit is disposed between the tester main board and the probe card, and the contact block has a plurality of connectors connected to each of the tester main board and the probe card.

In this inspection device, there is known a technique in which a diagnosis substrate having the same circuit configuration as that of a probe card and having a closed electrical path is attached instead of the probe card, and a self-diagnosis is performed to determine whether or not connectors are in the normal state (see, e.g., Patent documents 1 and 2). In this technique, resistance values of the connectors are measured by the diagnosis substrate, and the diagnosis result shows "Fail" when there is a connector having a resistance value higher than a reference resistance value. The self-diagnosis is performed at various timings, such as before a shipment of the inspection device, at the start-up of the inspection device, before the start of the inspection, between lots, during the maintenance, and the like.

Prior Art

Patent document 1: Japanese Patent Application Publication No. H08-306750
Patent document 2: Japanese Patent Application Publication No. H10-150082

In the case of diagnosing the connectors with the diagnosis substrate, when the diagnosis is performed immediately after the diagnosis substrate is attached, the resistance values of the connectors may be higher than the reference value due to an unstable contact state between the connectors and the diagnosis substrate, which is caused by environmental factors such as particles (foreign substances, oxide film) and the like. Therefore, the diagnostic result may show "Fail" even if the connectors 43 are actually in the normal state. When the diagnostic result is "Fail," it is required to remove the contact block and clean the connectors or discover the cause of "Fail." This takes a long time and affects the production. Therefore, it is desirable to suppress the occurrence of "Fail" caused by the unstable contact state and to increase the yield of the diagnosis.

SUMMARY

In view of the above, the present invention provides a technique capable of suppressing an occurrence of "Fail" caused by an unstable contact state between the connectors and the diagnosis substrate.

In accordance with a first aspect of the present invention, there is provided a diagnostic method for an inspection device wherein the inspection device includes a stage for mounting thereon a substrate, an attachment part to which a probe card that brings probes of the probe card into contact with devices formed on the substrate is attached, a tester for applying electrical signals to the devices formed on the substrate through the probe card attached to the attachment part to inspect electrical characteristics of the devices, and a connection member having multiple connectors to electrically connect the multiple connectors with the tester and the probe card while being disposed between the tester and the probe card, the diagnostic method for the inspection device performing a self-diagnosis of the multiple connectors, including: attaching a diagnosis substrate instead of the probe card; performing a stabilization process for stabilizing a contact between the diagnosis substrate and the multiple connectors of the connection member after the diagnosis substrate is attached; and diagnosing the multiple connectors after the stabilization process.

In the first aspect, the stabilization process may be performed by not applying a voltage to the diagnosis substrate for a predetermined period of time after the diagnosis substrate is attached and brought into contact with the connectors. Further, the predetermined period of time may be 30 minutes or more.

Further, the stabilization process may be performed by applying a pulse-shaped voltage of a predetermined value to the diagnosis substrate for a predetermined number of times after the diagnosis substrate is attached and brought into contact with the connectors. The voltage may be 1V or higher, and the pulse-shaped voltage may be applied 30 times or more.

In accordance with a second aspect of the present invention, there is provided an inspection system including: a stage configured to mount thereon a substrate; an attachment part to which a diagnosis substrate or a probe card that brings probes of the probe card into contact with devices formed on the substrate is attached; a tester configured to apply electrical signals to the devices formed on the substrate through the probe card attached to the attachment part to inspect electrical characteristics of the devices or to apply electrical signals to the diagnosis substrate attached to the attachment part; a connection member having multiple connectors to electrically connect the multiple connectors with the tester and the probe card while being disposed between the tester and the probe card or with the tester and the diagnosis substrate while being disposed between the tester and the diagnosis substrate; a transfer device configured to transfer the substrate to the stage or transfer the probe card or the diagnosis substrate to the attachment part; and a control unit configured to control an inspection of the electrical characteristics and a diagnosis of the connectors using the diagnosis substrate. In the case of performing the diagnosis of the connectors using the diagnosis substrate after the diagnosis substrate is attached, the control unit performs a stabilization process for stabilizing a contact between the diagnosis substrate and the connectors of the connection member and, then, performs the diagnosis of the connectors.

In accordance with the present invention, the stabilization process for stabilizing the contact between the diagnosis substrate and the multiple connectors of the connection member is performed after the diagnosis substrate is attached and, then, the diagnosis of the connectors is performed after the stabilization process. Therefore, it becomes possible to suppress the occurrence of "Fail" caused by the unstable contact state between the diagnosis substrate and the multiple connectors.

DETAILED DESCRIPTION

Hereinafter, embodiments will be described in detail with reference to the accompanying drawings.

Inspection System

First, an example of an overall configuration of an inspection system to which a diagnostic method of the present invention is applied will be described.

Figure 1:
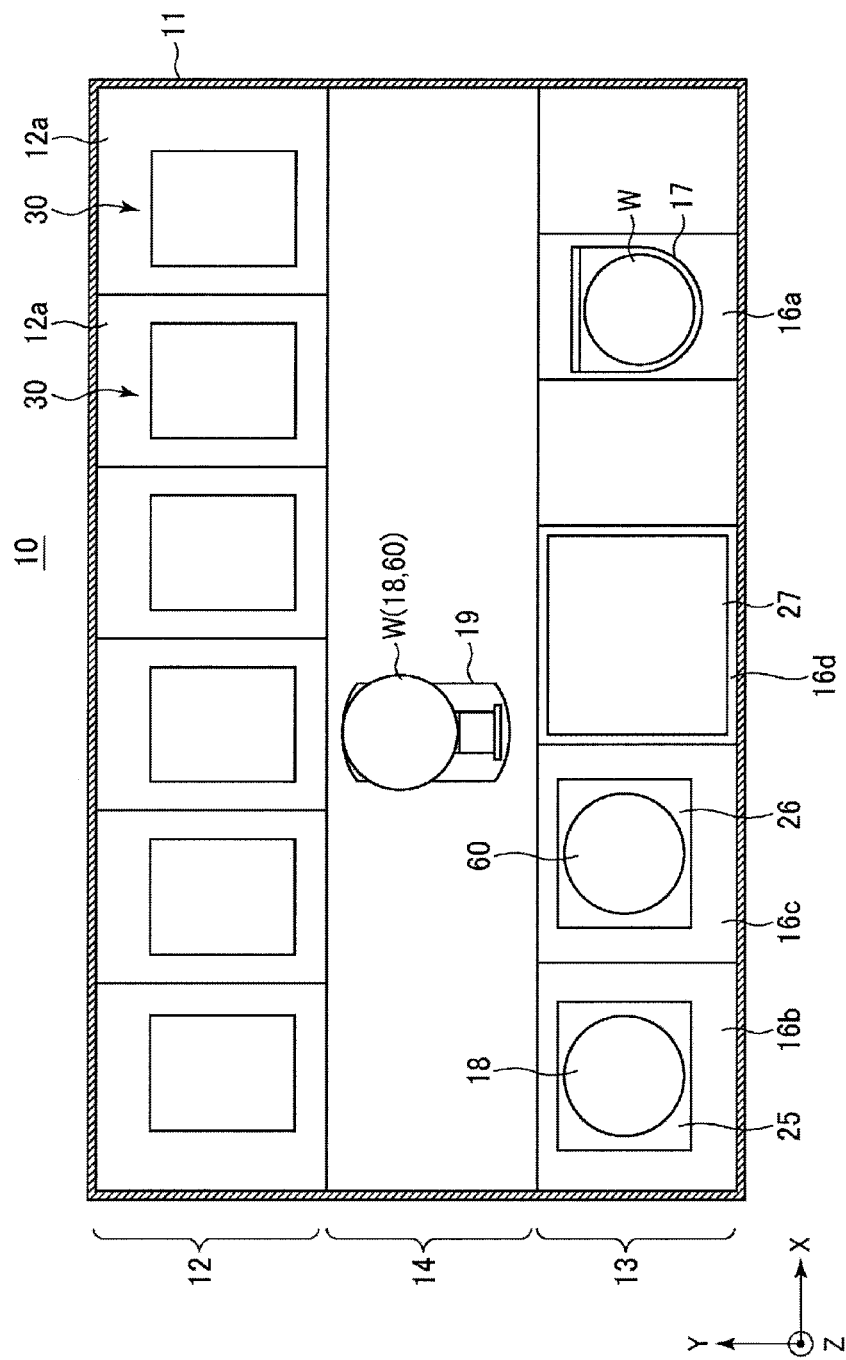
FIG. 1 is a horizontal cross-sectional view schematically showing an exemplary configuration of an inspection system.

FIG. 1 is a horizontal cross-sectional view schematically showing an exemplary configuration of the inspection system.

In FIG. 1, an inspection system 10 includes a housing 11. The housing 11 includes an inspection section 12 for inspecting electrical characteristics of semiconductor devices on the wafer W, a loading/unloading section 13 for loading and unloading the wafer W or the like into and from the inspection section 12, and a transfer section 14 provided between the inspection section 12 and the transfer section 13.

The inspection section 12 has therein a plurality of (six in this example) inspection rooms 12a arranged in the X direction. An inspection device (prober) 30 is disposed in each inspection room 12a.

The loading/unloading section 13 is divided into multiple ports including a wafer loading/unloading port 16a accommodating, e.g., a FOUP 17 as a container accommodating a plurality of wafers W, a probe-card-loader port 16b accommodating a probe card loader 25 where the probe card 18 is loaded or unloaded, a diagnosis-substrate-loader port 16c accommodating a diagnosis substrate loader 26 where a diagnosis substrate 60 is loaded or unloaded, and a control-unit-accommodation port 16d accommodating a control unit 27 for controlling operations of the respective components of the inspection system 10.

A movable transfer device 19 is disposed in the transfer section 14. The transfer device 19 transfers the wafer W from the wafer loading/unloading port 16a of the loading/unloading section 13 to a chuck top (stage) for attracting and holding the wafer W in each inspection device 30, and transfers the wafer W having devices of which inspection of electrical characteristics have been completed from the chuck top of the corresponding inspection device 30 to the loading/unloading port 16a. Further, the transfer device 19 transfers the probe card 18 requiring maintenance from each inspection device 30 to the probe card loader 25 of the probe-card-loader port 16b, and transfers a new probe card 18 or the probe card 18 whose maintenance has been completed to each inspection device 30. When self-diagnosis is performed, the transfer device 19 transfers the diagnosis substrate 60 from the diagnosis substrate loader 26 of the diagnosis substrate loader port 16c in the loading/unloading section 13 to each inspection device 30.

In each inspection room 12a, a plurality of inspection devices 30 may be stacked in multiple stages. In that case, the transfer section 14 and the transfer device 19 may be provided for each stage.

Inspection Device

Figure 2:
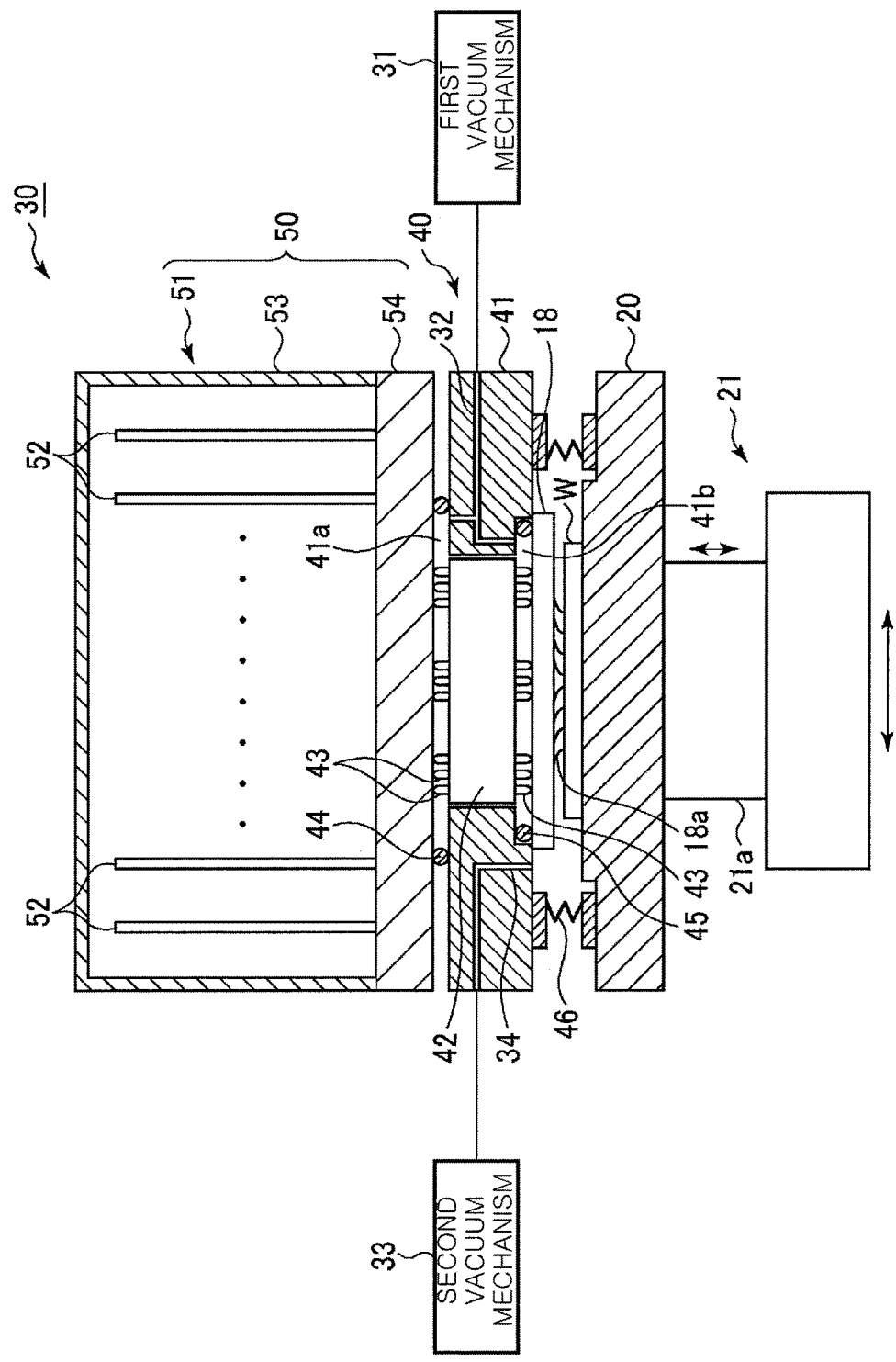
FIG. 2 is a cross-sectional view of an inspection device of the inspection system shown in FIG. 1.

Next, the inspection device 30 will be described in detail. FIG. 2 is a cross-sectional view of the inspection device 30. As shown in FIG. 2, the inspection device 30 includes a tester 50, an interface unit 40, a chuck top 20, and an aligner 21.

The tester 50 has a test head 51 in which a plurality of tester module boards 52 are accommodated in a housing 53, and a tester main board 54 disposed under the test head 51. The tester module boards 52 are mounted upright in slots of the tester main board 54.

The tester module boards 52 are provided for a power supply to the devices on the wafer W, a waveform input (driver), a waveform measurement (comparator), a voltage output, a current output, a voltage measurement and a current measurement. The tester main board 54 is configured to transmit and receive an input/output of the waveform, a voltage, and a current between the tester module boards 52 and the probe card 18 to be described later.

The interface unit 40 includes an annular support plate (attachment part) 41 that is disposed below the tester main board 54 to support and hold the probe card 18 on a bottom surface thereof, and a contact block (connection member) 42 that is fitted to a central space of the support plate 41 to electrically connect the tester main board 54 and the probe card 18. Multiple connectors 43 that are pogo pins for electrically connecting the probe card 18 and the tester main board 54 are disposed on an upper surface and a bottom surface of the contact block 42.

The probe card 18 has an electric circuit therein, and includes a plurality of probes to be in contact with electrodes of the devices formed on the wafer W.

Figure 3:
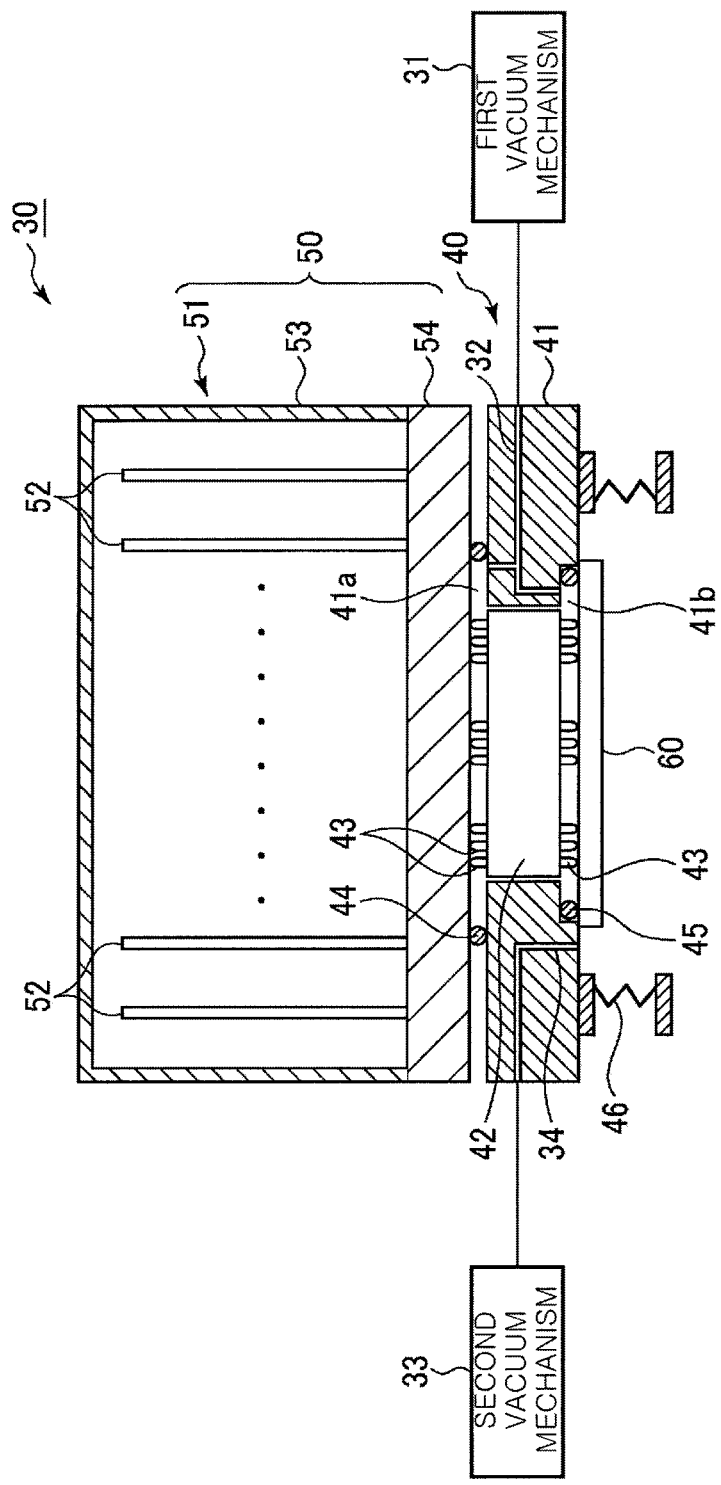
FIG. 3 is a cross-sectional view showing a state in which a diagnosis substrate is attached to the inspection device of the inspection system shown in FIG. 1.

During the normal inspection, the probe card 18 is attached to the bottom surface of the support plate 41. During the self-diagnosis of the connector 43 of the contact block 42, the diagnosis substrate 60, instead of the probe card 18, is attached to the bottom surface of the support plate 41 as shown in FIG. 3. The diagnosis substrate 60 has the same electrical circuit as that of the probe card 18 except that the diagnosis substrate 60 has no probes and electrical path thereof is closed.

The contact block 42 has a holder (not shown) at an upper portion thereof to be supported on the support plate 41 by the holder. An annular seal member 44 is disposed on the upper surface of the support plate 41 while being in close contact with the bottom surface of the tester main board 54. Further, an annular seal member 45 is disposed on the bottom surface of the support plate 41 to be in close contact with the probe card 18 or the diagnosis substrate 60.

A gas exhaust path 32 is formed in the support plate 41. The gas exhaust path 32 has one end connected to a line extending from a first vacuum mechanism 31 including a vacuum pump and the other ends connected to a space 41a surrounded by the seal member 44 between the tester main board 54 and the support plate 41 and a space 41b surrounded by the seal member 45 between the support plate 41 and the probe card 18 or between the support plate 41 and the diagnosis substrate 60. By vacuum suction of the first vacuum mechanism 31, the spaces 41a and 41b are depressurized; the support plate 41 is held to the tester main board 54 by vacuum-attraction with the seal member 44 interposed therebetween; and the probe card 18 or the diagnosis substrate 60 is held to the support plate 41 by vacuum-attraction with the seal member 45 interposed therebetween.

A cylindrical bellows 46 is disposed on the bottom surface of the support plate 41 to surround an arrangement area of the probe card 18.

The chuck top 20 is configured to attract and hold the wafer W serving as an inspection target object. The aligner is disposed under the chuck top 20. An elevation part 21a of the aligner 21 supports the chuck top 20, and the chuck top 20 is moved vertically and horizontally (XYZ directions) by the aligner 21. Accordingly, the wafer W mounted on the chuck top 20 is positioned to face the probe card 18. The aligner 21 is shared by six inspection devices 30 on the same stage, and is movable along the X direction.

In order to inspect the wafer W, the chuck top 20 is raised by the aligner 21 in a state where the probe card 18 is attached to the bottom surface of the support plate 41, and the probes of the probe card 18 are brought into contact with the wafer W as shown in FIG. 2. At this time, the bottom surface of the bellows 46 is brought into close contact with the chuck top 20 by a seal member (not shown), and the inner space of the bellows 46 is sealed. A gas exhaust path 34 is formed in the support plate 41. The gas exhaust path 34 has one end connected to a line extending from a second vacuum mechanism 33 including a vacuum pump and the other end connected to the sealed inner space of the bellows 46. By vacuum suction of the second vacuum mechanism 33, the sealed space is depressurized, and the chuck top 20 is held to the support plate 41 by vacuum-attraction with the bellows 46 interposed therebetween. In a similar manner, when the diagnosis substrate 60 is attached, the chuck top 20 is raised to the same position and a sealed space is formed by the bellows 46. By depressurizing the sealed space using the second vacuum mechanism 33, the chuck top 20 is held to the support plate 41 by vacuum-attraction. However, it is not necessary for the chuck top 20 to be held by vacuum-attraction.

In the case of performing the inspection using the inspection device 30, the probe card 18 is attached by the vacuum-attraction, and electrical signals are applied from the tester module boards 52 in the test head 51 to the devices of the wafer W through the tester main board 54 and the probes 18a of the probe card 18. The electrical characteristics are inspected using signals returned to the tester module boards 52. In the case of performing the self-diagnosis, the diagnosis substrate 60 is attached, instead of the probe card 18, and the electrical resistances of the connectors 43 are measured to perform the self-diagnosis.

In a state where the chuck top 20 is held by vacuum-attraction, the aligner 21 is retracted downward and moved in the X direction to deliver the wafer W or the like to and from a chuck top 20 of another inspection device 30 on the same stage.

Control Unit

Figure 4:
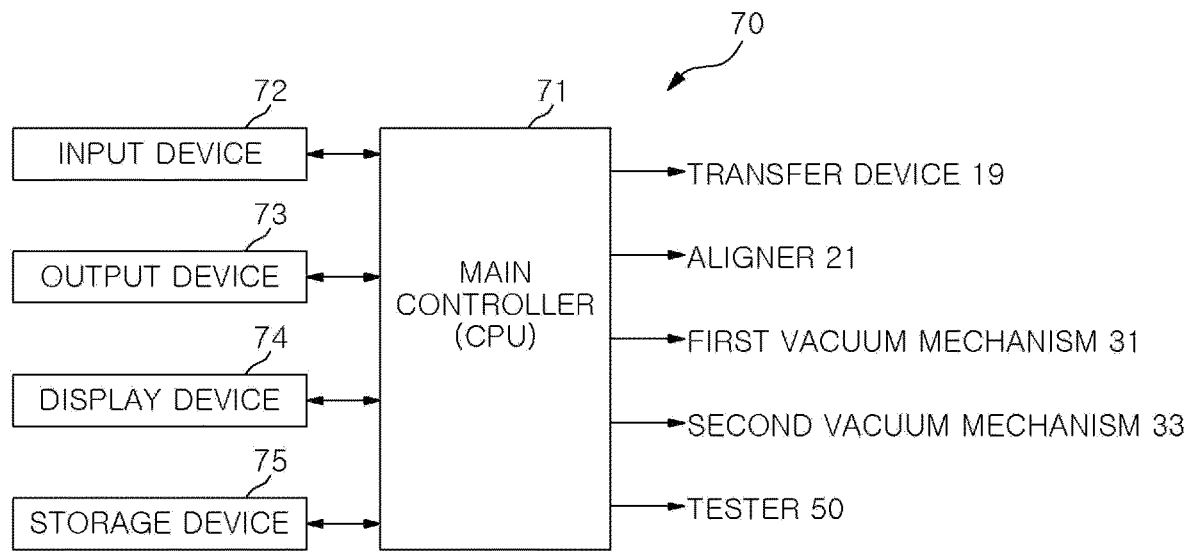
FIG. 4 is a block diagram showing a control unit of the inspection system shown in FIG. 1.

The control unit 27 is configured to control the respective components of the inspection system 10, e.g., the transfer device 19, the aligner 21 of the inspection device 30, the first and the second vacuum mechanisms 31 and 33, the tester 50, and the like. As shown in FIG. 4, the control unit 27 includes a main controller 71 having a CPU (computer) for controlling those components, an input device 72 such as a keyboard, a mouse or the like, an output device 73 such as a printer or the like, a display device 74 such as a display or the like, and a storage device 75 having a storage medium. The operation of the inspection system 10 is executed based on a processing recipe stored in the storage medium.

The control unit 27 selects one of an inspection mode for inspecting the wafer W and a diagnosis mode for performing self-diagnosis using the diagnosis substrate 60 by using the input device 72. When the inspection mode is selected, the main controller 71 performs an inspection sequence. When the diagnosis mode is selected, the main controller 71 performs a self-diagnosis sequence.

Inspection Operation

Next, the inspection operation in the inspection system 10 will be described.

In order to perform the inspection, an appropriate probe card 18 is transferred from the probe card loader 25 to each inspection device 30 by the transfer device 19 and is attached to the support plate 41 through vacuum-attraction.

Thereafter, the wafer W is transferred from the FOUP of the wafer loading/unloading port 16a to each inspection device 30 by the transfer device 19. Then, the position of the chuck top 20 is determined by the aligner 21, and the space surrounded by the bellows 46 is vacuum-evacuated to hold the chuck top 20 to the support plate 41 through vacuum-attraction. Then, the probes 18a of the probe card 18 are brought into contact with the electrodes of the devices formed on the wafer W, and the electrical inspection is performed by the tester 50.

Figure 5:
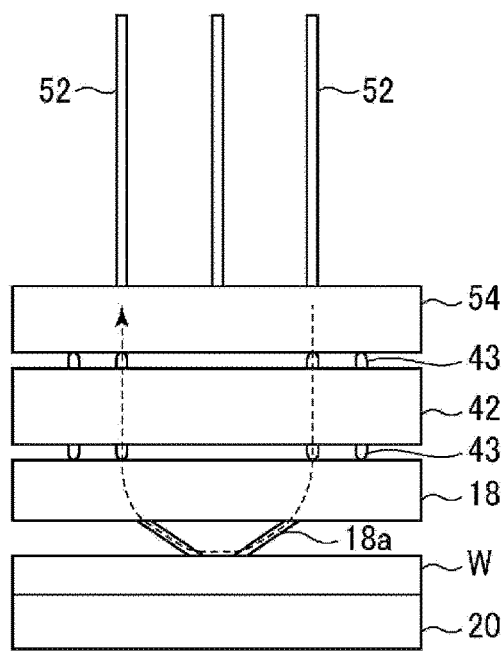
FIG. 5 schematically shows a signal flow during a device inspection.

Here, as shown in FIG. 5, the electrical signals from the tester module boards 52 arranged in the test head 51 reach the devices on the wafer W through the tester main board 54, the contact block 42, and the probe card 18, and then returns from the devices to the tester module boards 52 through the probe card 18, the contact block 42, and the tester main board 54, thereby inspecting the electrical characteristics of the devices using the electrical signal. Specifically, the tester 50 outputs a voltage, a current, a logic waveform, and the like to the devices, and measures a voltage, a current, and a logic waveform from the devices to determine PASS and NG of the devices.

During the inspection of the electrical characteristics, the aligner 21 is moved to another inspection device 30, and the delivery of the wafer W from the transfer device 19 to the chuck top 20 and the position alignment of the chuck top 20 are performed. In the inspection device 30 that has completed the inspection, the sealed inner space of the bellows 46 is returned to an atmosphere state, the chuck top 20 thereof is mounted on the aligner 21, and the inspected wafer W is returned to the FOUP 17 of the wafer loading/unloading port 16a by the transfer device 19. The above-described operations are continuously performed on a plurality of wafers W simultaneously and in parallel.

Self-Diagnosis

Next, the self-diagnosis will be described.

The self-diagnosis is performed at various timings, such as before a shipment of the inspection device, at the start-up of the inspection device, before the start of the inspection, between lots, during the maintenance, and the like.

When the self-diagnosis is to be performed, if the probe card 18 is not being attached, the diagnosis substrate 60 is transferred from the diagnosis substrate loader 26 to each inspection device 30 by the transfer device 19 and is attached to the support plate 41 through vacuum-attraction. On the other hand, if the probe card 18 is being attached, the diagnosis substrate 60 is transferred and attached after the probe card 18 is removed and transferred to the probe card loader 25 by the transfer device 19.

Figure 6:
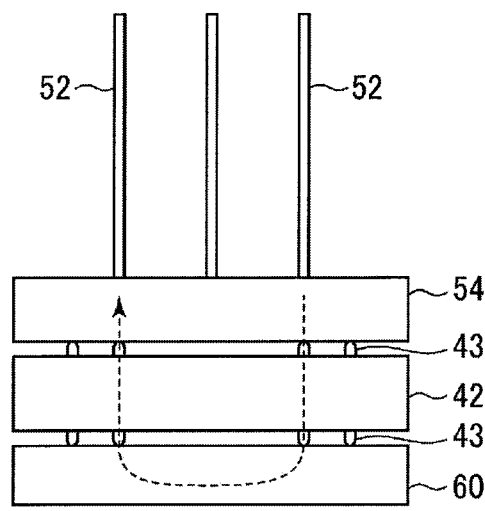
FIG. 6 schematically shows a signal flow during a diagnosis.

When the self-diagnosis is performed after the diagnosis substrate 60 is attached, electrical signals from the tester module boards 52 arranged in the test head 51 reach the diagnosis substrate (inspection substrate) 60 through the tester main board 54 and the contact block 42 and then returns from the diagnosis substrate 60 to the tester module boards 52 through the contact block 42 and the tester main board 54, as shown in FIG. 6. Accordingly, the resistance values of the connectors 43 are measured.

Here, when the diagnosis is performed immediately after the attachment of the diagnosis substrate 60, the resistance values of the connectors 43 may be higher than the reference value due to an unstable contact state between the connectors 43 and the diagnosis substrate 60, which is caused by environmental factors such as particles (foreign substances, oxide film) and the like. Therefore, the diagnostic result may show "Fail" even if the connectors 43 are actually in the normal state. When the diagnostic result is "Fail," it is required to remove the contact block 42 and inspect the connectors 43 of the contact block 42. This takes a long time and affects the production. Therefore, it is desirable to suppress the occurrence of "Fail" caused by the unstable contact state and to increase the yield of the diagnosis.

Figure 7:
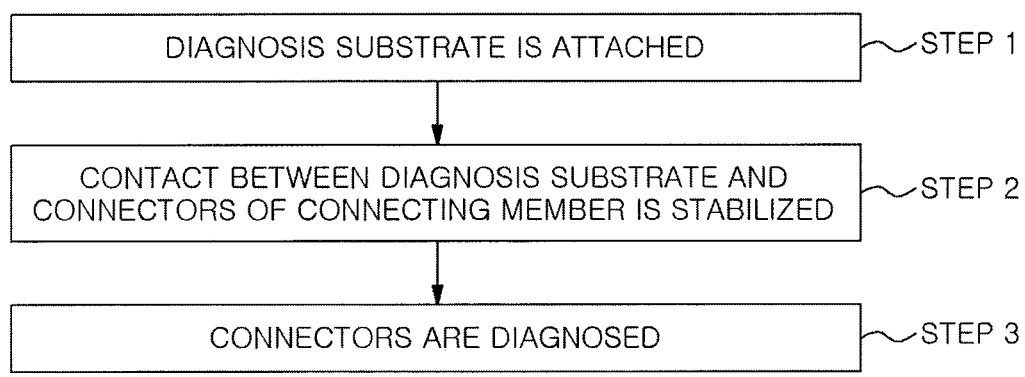
FIG. 7 is a flowchart for explaining a diagnostic method.

Therefore, as shown in FIG. 7, the diagnostic method of the present embodiment includes a step of attaching the diagnosis substrate (step 1), a step of stabilizing the contact between the diagnosis substrate and the connectors of the connecting member (step 2), and a step of diagnosing the connectors (step 3). The diagnostic method may include a first diagnostic method and a second diagnostic method that are different from each other in the stabilization process.

First Diagnostic Method

First, the first diagnostic method will be described.

In the first diagnostic method, the diagnosis substrate 60 is attached first. Then, a resistance stabilization process is performed by not applying a voltage for a certain period of time after the connectors 43 and the diagnosis substrate are brought into contact with each other. Then, the diagnosis (test) is started after the certain period of time elapses.

Figure 8:
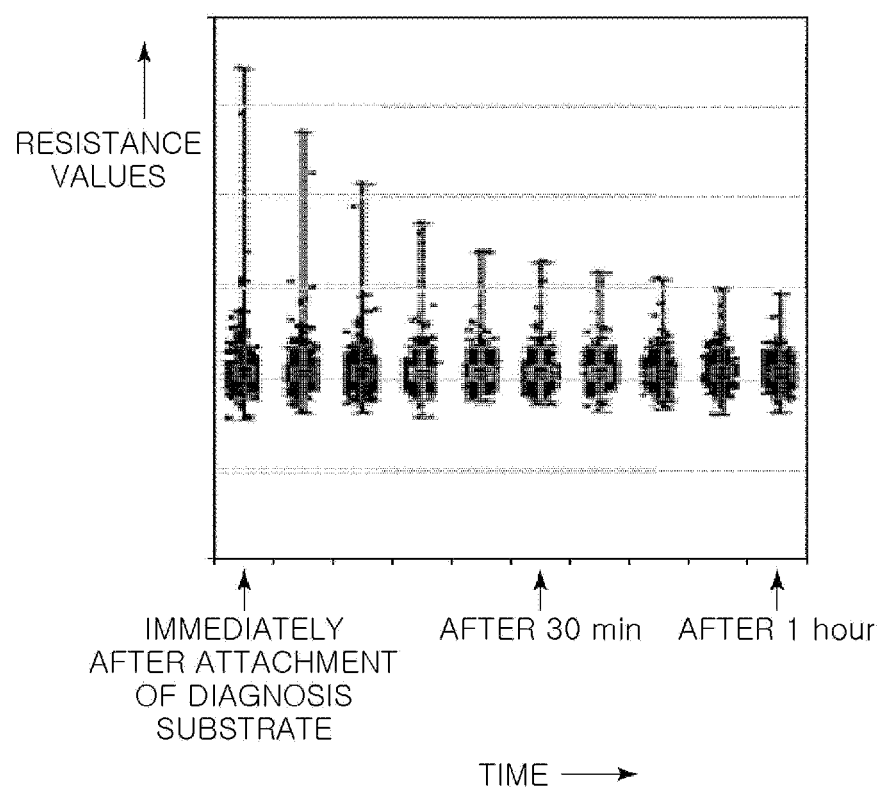
FIG. 8 shows temporal changes of resistance values of connectors in the case of applying a voltage to a diagnosis substrate in which a vertical axis represents the resistance values of the connectors measured at 6 minute intervals.

FIG. 8 shows temporal changes of the resistance values of the connectors in the case of applying a voltage to the diagnosis substrate. In FIG. 8, the vertical axis represents the resistance values of the connectors measured at six minute intervals. At each time, the resistance values of the individual connectors are plotted. As can be seen from FIG. 8, the maximum resistance value of the connectors is high immediately after the attachment of the diagnosis substrate 60. However, the maximum resistance value decreases as time elapses. The maximum resistance value is reduced by half after 30 minutes from the attachment of the diagnosis substrate 60 and is reduced by 70% after one hour from the attachment of the diagnosis substrate 60.

It is generally known that as the load on the contact point increases, the apparent area or the actual area of the contact point increases, which leads to the decrease of the resistance value. However, the diagnosis substrate 60 maintains a constant load, and the load thereof is not increased. As can be seen from the result of FIG. 8 even when the load is maintained at a constant level without being increased, it was found that the contact area of the connectors 43 and the diagnosis substrate 60 increases and the resistance value decreases.

In view of the above characteristics, the first diagnostic method performs the resistance stabilization process in such a manner that the diagnosis substrate 60 is attached and brought into contact with the connectors 43, and then the diagnosis substrate 60 maintains this contact state for a predetermined period of time without applying a voltage thereto to stabilize the resistance. The diagnosis (test) is started after the predetermined period of time elapses. Preferably, the diagnosis (test) is started after 30 minutes from the attachment of the diagnosis substrate 60. More preferably, the diagnosis is started after 1 hour from the attachment of the diagnosis substrate 60.

In the present embodiment, since the diagnosis substrate 60 is attached through the vacuum-attraction, the resistance value is more likely to be reduced by the pressure at the time of the vacuum-attraction.

In the actual execution of the first diagnostic method, when the diagnosis mode is selected, the control unit 27 sets the self-diagnosis sequence such that the diagnosis is started after the diagnosis substrate 60 maintains the contact state without applying a voltage thereto for a predetermined period of time from the attachment of the diagnosis substrate 60. Alternatively, when the resistance stabilization mode is selected after the diagnosis mode is selected, the control unit 27 sets the self-diagnosis sequence such that the diagnosis is started after the diagnosis substrate 60 maintains the contact state without applying a voltage thereto for a predetermined period of time from the attachment of the diagnosis substrate 60.

Second Diagnostic Method

Next, the second diagnostic method will be described.

In the second diagnostic method, the diagnosis substrate 60 is attached first. Then, a resistance stabilization process of applying a pulse-shaped voltage (voltage pulse) of a predetermined value to the diagnosis substrate 60 for a predetermined number of times is performed. Thereafter, the diagnosis (test) is started.

Figure 9:
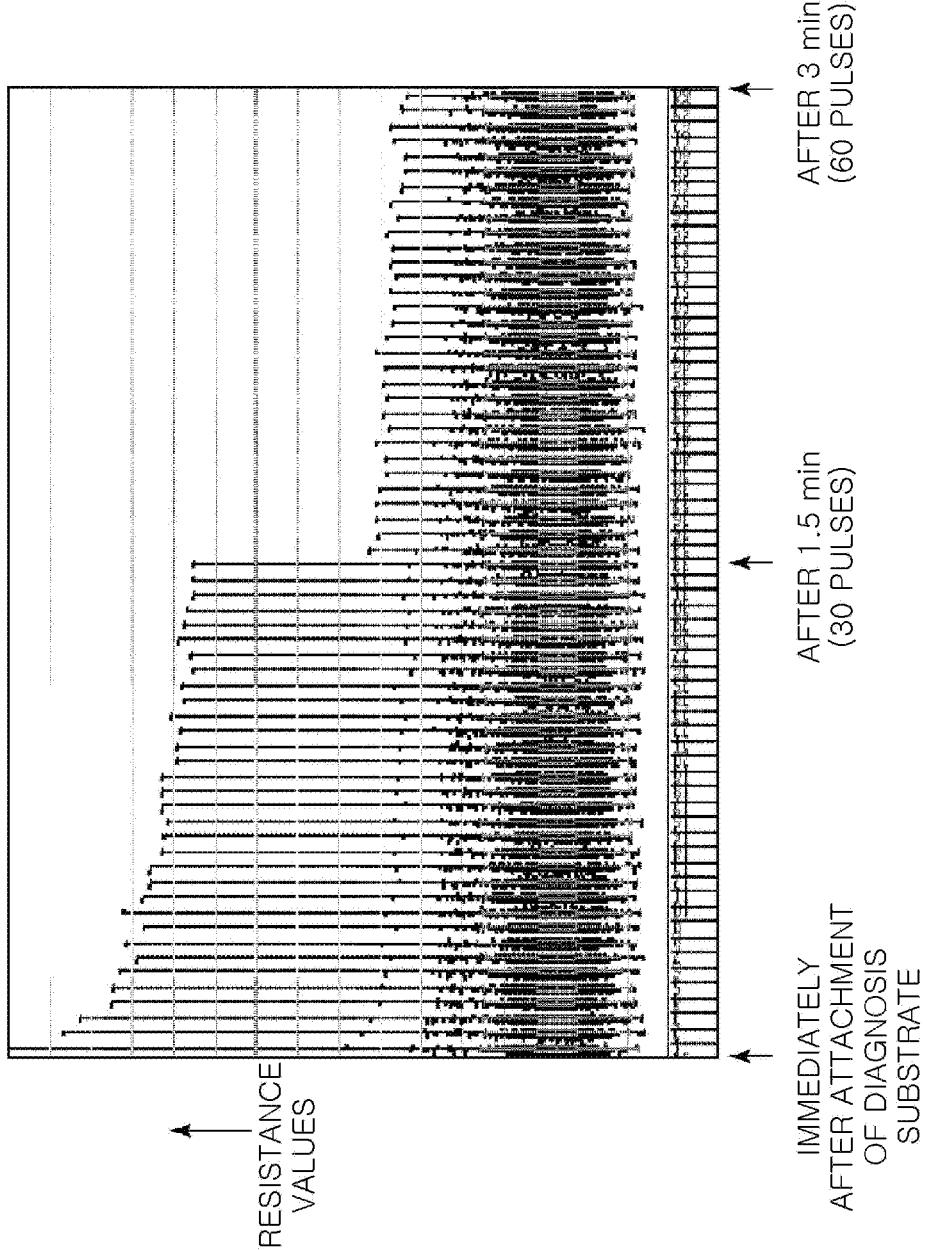
FIG. 9 shows temporal changes of the resistance values of the connectors in the case of applying the voltage to the diagnosis substrate in which a vertical axis represents the resistance values of the connectors measured in a simple test where a pulse-shaped voltage is applied at 3 second intervals.

FIG. 9 shows temporal changes of the resistance values of the connectors in the case of applying a voltage to the diagnosis substrate. In FIG. 9, the vertical axis represents the resistance values of the connectors measured in a simple test in which a voltage pulse is applied at 3 second intervals. At this time, the voltage is 1V. At each time, the resistance values of the individual connectors are plotted. As can be seen from FIG. 9, when the voltage pulse is continuously applied in the simple test, the resistance values of the connectors 43 are reduced by 70% after 1.5 minutes (after 30 pulses are applied).

This is because fine foreign substances or an oxide film adhered to the contact surfaces between the connectors 43 and the diagnosis substrate 60 may be removed by current crowding.

Therefore, in the second diagnostic method, the diagnosis substrate 60 is attached first, and the resistance stabilization process of applying the pulse-shaped voltage of a predetermined value to the diagnosis substrate 60 for a predetermined number of times is performed to stabilize the resistance. Thereafter, the diagnosis (test) is started. At this time, it is preferable to set the voltage to be 1V or higher and the number of the voltage pulse application is 30 times or more.

In the actual execution of the second diagnostic method, when the diagnosis mode is selected, the control unit 27 sets the self-diagnosis sequence such that the diagnosis is started after the resistance stabilization process of applying a voltage pulse higher than a predetermined threshold to the diagnosis substrate 60 for a predetermined number of times or more is performed. Alternatively, when the resistance stabilization mode is selected after the diagnosis mode is selected, the control unit 27 sets the self-diagnosis sequence such that the diagnosis is started after the resistance stabilization process of applying the voltage pulse to the diagnosis substrate 60 for a predetermined number of times.

Other Applications

The present invention is not limited to the above-described embodiments, and various modifications can be made without departing from the scope of the present invention.

For example, although the above embodiments have described the case where the present invention is applied to the inspection system including a plurality of inspection devices, the present invention may be applied to one inspection device without being limited thereto.

Moreover, although the above embodiments have described the example in which the probe card or the diagnosis substrate is attached through the vacuum-attraction, the probe card or the diagnosis substrate may be attached by other methods such as an installation with screws and the like without being limited thereto.

Further, the diagnostic method of the above-described embodiments includes, as the stabilization process, the process of not applying a voltage to the diagnosis substrate for a predetermined period of time after the attachment of the diagnosis substrate and the process of applying a voltage pulse higher than a predetermined threshold to the diagnosis substrate for a predetermined number of times or more. However, the present invention is not limited to the above-described embodiments as long as the contact between the connectors and the diagnosis substrate can be stabilized. In addition, although the above-described embodiments have described the case where the stabilization process is performed in the diagnostic method using the diagnosis substrate, the stabilization process may also be applied to the case where the actual probe card is attached and the devices formed on the wafer W are inspected.

DESCRIPTION OF REFERENCE NUMERALS

10: inspection system
18: probe card
18*a*: probes
19: transfer device
20: chuck top
21: aligner
21*a*: elevation part
25: probe card loader
26: diagnosis substrate loader
27: control unit
30: inspection device
40: interface unit
41: support plate
42: contact block
43: connectors
50: tester
51: test head
52: tester module board
54: tester main board
60: diagnosis substrate
71: main controller
72: input device
73: output device
74: display device
75: storage device
W: semiconductor wafer

The invention claimed is:

1. A diagnostic method for an inspection device, comprising:
    attaching a probe card to an attachment part of the inspection device during an inspection operation;
    applying electrical signals to devices formed on a substrate mounted on a stage of the inspection device via a connection having multiple connectors of a connection member of the inspection device, during the inspection operation;
    removing the probe card from the attaching part of the inspection device;
    attaching a diagnosis substrate to the attachment part of the inspection device for a self-diagnosis operation;
    performing a stabilization process for stabilizing a contact between the diagnosis substrate and the multiple connectors of the connection member after the diagnosis substrate is attached; and
    diagnosing the multiple connectors after the stabilization process during the self-diagnosis operation.

2. The diagnostic method of claim 1, wherein the stabilization process is performed by not applying a voltage to the diagnosis substrate for a predetermined period of time after the diagnosis substrate is attached and brought into contact with the connectors.

3. The diagnostic method of claim 2, wherein the predetermined period of time is 30 minutes or more.

4. The diagnostic method of claim 1, wherein the stabilization process is performed by applying a pulse-shaped voltage of a predetermined value to the diagnosis substrate for a predetermined number of times after the diagnosis substrate is attached and brought into contact with the connectors.

5. The diagnostic method of claim 4, wherein the voltage is 1V or higher.

6. The diagnostic method of claim 5, wherein the pulse-shaped voltage is applied 30 times or more.

7. The diagnostic method of claim 4, wherein the pulse-shaped voltage is applied 30 times or more.

8. An inspection system comprising:
a stage configured to mount thereon a substrate;
an attachment part, to which a diagnosis substrate or a probe card that brings probes of the probe card into contact with devices formed on the substrate is attached;
a tester configured to apply electrical signals to the devices formed on the substrate through the probe card attached to the attachment part to inspect electrical characteristics of the devices or to apply electrical signals to the diagnosis substrate attached to the attachment part;
a connection member having multiple connectors to electrically connect the multiple connectors with the tester and the probe card while being disposed between the tester and the probe card, or with the tester and the diagnosis substrate while being disposed between the tester and the diagnosis substrate;
a transfer device configured to transfer the substrate to the stage or transfer the probe card or the diagnosis substrate to the attachment part; and
a control unit configured to control an inspection of the electrical characteristics and a diagnosis of the connectors using the diagnosis substrate,
wherein in the case of performing the diagnosis of the connectors using the diagnosis substrate after the diagnosis substrate is attached, the control unit performs a stabilization process for stabilizing a contact between the diagnosis substrate and the connectors of the connection member and, then, performs the diagnosis of the connectors.

9. The inspection system of claim 8, wherein the control unit performs the stabilization process by not applying a voltage to the diagnosis substrate for a predetermined period of time after the diagnosis substrate is attached and brought into contact with the connectors.

10. The inspection system of claim 9, wherein the control unit sets the predetermined period of time to be 30 minutes or more.

11. The inspection system of claim 8, wherein the control unit performs the stabilization process by applying a pulse-shaped voltage of a predetermined value to the diagnosis substrate for a predetermined number of times after the diagnosis substrate is attached and brought into contact with the connectors.

12. The inspection system of claim 11, wherein the control unit sets the voltage to be 1V or higher.

13. The inspection system of claim 12, wherein the control unit controls the pulse-shaped voltage to be applied 30 times or more.

14. The inspection system of claim 11, wherein the control unit controls the pulse-shaped voltage to be applied 30 times or more.

* * * * *